United States Patent
Zhang et al.

(10) Patent No.: US 10,204,787 B2
(45) Date of Patent: Feb. 12, 2019

(54) MANUFACTURE METHOD OF POLYSILICON THIN FILM AND POLYSILICON TFT STRUCTURE

(71) Applicant: Shenzhen China Star Optoelectronics Technology Co., Ltd., Shenzhen (CN)

(72) Inventors: Liangfen Zhang, Shenzhen (CN); Shuichih Lien, Shenzhen (CN); Changcheng Lo, Shenzhen (CN); Yuanchun Wu, Shenzhen (CN); Yuanjun Hsu, Shenzhen (CN); Hoising Kwok, Shenzhen (CN); Man Wong, Shenzhen (CN); Rongsheng Chen, Shenzhen (CN); Wei Zhou, Shenzhen (CN); Meng Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 411 days.

(21) Appl. No.: 14/892,199

(22) PCT Filed: Jun. 25, 2015

(86) PCT No.: PCT/CN2015/082265
§ 371 (c)(1),
(2) Date: Nov. 19, 2015

(87) PCT Pub. No.: WO2016/197410
PCT Pub. Date: Dec. 15, 2016

(65) Prior Publication Data
US 2017/0194151 A1    Jul. 6, 2017

(30) Foreign Application Priority Data
Jun. 9, 2015 (CN) .......................... 2015 1 0314265

(51) Int. Cl.
*H01L 21/265* (2006.01)
*H01L 29/66* (2006.01)
(Continued)

(52) U.S. Cl.
CPC .. *H01L 21/26513* (2013.01); *H01L 21/02422* (2013.01); *H01L 21/02488* (2013.01);
(Continued)

(58) Field of Classification Search
CPC ............ H01L 21/26513; H01L 21/425; H01L 23/298; H01L 27/1274
See application file for complete search history.

(56) References Cited

U.S. PATENT DOCUMENTS 4,740,481 A * 4/1988 Wilson .............. H01L 21/32155
148/DIG. 24
5,466,619 A * 11/1995 Choi .................. H01L 21/2022
438/162
(Continued)

FOREIGN PATENT DOCUMENTS

JP    5-82514    4/1993
JP    5-275699    10/1993

OTHER PUBLICATIONS

A.F. Saavedra et al. "Comparison of {311} Defect Evolution in SIMOX and Bonded SOI Materials", 2004, J. Electrochem. Soc., vol. 151, pp. G266-G270.*

*Primary Examiner* — Michael Lebentritt
*Assistant Examiner* — Suberr Chi
(74) *Attorney, Agent, or Firm* — Leong C. Lei

(57) ABSTRACT

The present invention provides a manufacture method of a polysilicon thin film and a polysilicon TFT structure. The manufacture method of the polysilicon thin film comprises: step 1, providing a substrate (1), and forming the polysilicon thin film (3) on the substrate (1), and a thickness of the
(Continued)

polysilicon thin film (3) accords with a required thickness of manufacturing a semiconductor element; step 2, implementing silicon self-ion implantation to the polysilicon thin film (3), and an implantation volume of silicon ion is lower than a measurement limit for making polysilicon be decrystallized. The manufacture method of the polysilicon thin film makes the implanted silicon ion to form interstitial silicon to move to the polysilicon grain boundary, which can reduce the defect concentration of the polysilicon grain boundary and improve the quality of the polysilicon thin film. The present invention provides a polysilicon TFT structure, of which the island shaped semiconductor layer is manufactured by the polysilicon thin film after low volume silicon self-ion implantation, which can reduce the grain boundary potential barrier in the activation stage, and enlarge the carrier mobility, and increase the on state current, and decrease the threshold voltage, and improve the TFT property.

11 Claims, 4 Drawing Sheets

(51) Int. Cl.
H01L 29/786 (2006.01)
H01L 21/02 (2006.01)
H01L 27/12 (2006.01)

(52) U.S. Cl.
CPC .. *H01L 21/02532* (2013.01); *H01L 21/02667* (2013.01); *H01L 27/1285* (2013.01); *H01L 29/66757* (2013.01); *H01L 29/78675* (2013.01)

(56) References Cited

U.S. PATENT DOCUMENTS 6,057,213 A * 5/2000 Lee .................. H01L 21/2022
117/8
2003/0013281 A1 * 1/2003 Chung .............. H01L 21/2026
438/488

* cited by examiner

| sample label | 1 | 2 | 3 | 4 | 5 | 6 |
|---|---|---|---|---|---|---|
| volume ($\times 10^{14}/cm^2$) | 2 | 4 | 6 | 8 | 10 | 100 |

| sample label | average carrier mobility ($cm^2/VS$) | standard deviation |
|---|---|---|
| 1 | 31.7 | 1.46 |
| 2 | 38.3 | 2.36 |
| 3 | 42.2 | 3.12 |
| 4 | 48.0 | 2.61 |
| 5 | 27.0 | 0.94 |
| 6 | 3.80 | 0.88 |

MANUFACTURE METHOD OF POLYSILICON THIN FILM AND POLYSILICON TFT STRUCTURE

FIELD OF THE INVENTION

The present invention relates to a display technology field, and more particularly to a manufacture method of a polysilicon thin film and a polysilicon TFT structure.

BACKGROUND OF THE INVENTION

In the display skill field, Liquid Crystal Display (LCD), Organic Light Emitting Diode (OLED) and other panel displays have been gradually replaced the CRT displays.

With the development of panel displays, the high resolution and low power consumption panels has constantly been demanded. The Low Temperature Poly-silicon (LTPS) Thin Film Transistor (TFT) draws the attentions of the industry related to the high resolution Active Matrix Liquid Crystal Display (AMLCD) and Active Matrix Organic Light Emitting Display (AMOLED) to be considered with great application value and potential. Compared with amorphous silicon (a-Si), the LTPS TFT has higher carrier mobility, which can reach up from dozens to hundreds $cm^2/VS$. The response speed of the element is fast, and the stability is good, which can satisfy the demands of the high resolution AMLCD and AMOLED. The LTPS TFT cannot only be the pixel switch but also can be employed to construct the peripheral driving circuit to realize circuit integration.

The LTPS is a branch of the poly-Si technology. The reason why the polysilicon material possesses higher electron mobility is due to the polysilicon structure of the polysilicon itself. Compared with the amorphous silicon of having high defect concentration and being highly disordered, the polysilicon is constructed by a plurality of ordered crystalline grains.

In prior arts, the polysilicon thin film can be obtained by Chemical Vapor Deposition (CVD); also can be obtained by implementing annealing process to the amorphous silicon to be decrystallized, and the common methods are: Solid Phase Crystallization (SPC), Metal-Induced Crystallization (MIC), Excimer Laser Annealing (ELA) and etc.

At present, the main factor of restricting the polysilicon TFT element property is the grain boundary among the polysilicon crystalline grains. A large amount of defects exist at the grain boundary. The grain sizes and distributions of the polysilicon thin film manufactured by the aforesaid various methods are different, and the numbers of the grain boundary defects are quite different, too.

Lots of methods have been proposed to focus how to improve the quality of the polysilicon thin film in the research literatures. Some researches have pointed out that the silicon self-ion implantation can be used to make the polysilicon thin film be decrystallized, and then the recrystallization is performed to reduce the crystal nucleus density and thus, enlarge the grain size after the recrystallization.

R. Reif and J. E. Knott (Electronics Letters, Vol. 17 No. 17, 1981) has already proved that with the silicon ion of high volume (such as $3\times10^{15}/cm^2$) to be implanted in the polysilicon thin film, most crystal structures of the polysilicon thin film can be decrystallized. Due to the tunnel effect of the ion implantation, only few crystal nucleuses are left. These crystal nucleuses grow to be large size grains in the following SPC recrystallization.

N. Yamauchi, etc (IEEE Electron Device Letters, Vol. 11, No. 1, 1990 and Journal of Applied Physics, vol. 75, pp. 3235-3257, 1994) utilizes the polysilicon obtained by the aforesaid method to manufacture TFTs. With the enlarged grain size, the mobility of the element increases, and the subthreshold swing is cliffy. However, in the meantime, the literature also reveals that the uniformity of the small size elements seriously descends because of the random distribution of the large grain sizes.

The above literatures indicates that the silicon self-ion implantation of high volume can decrystallize most of the polysilicon. The decrystallization makes the crystal nucleus density decreased and the large size grains are obtained after recrystallization. The enlarged grains makes the grain boundary defects decreased, and the element property be improved. Nevertheless, this method needs silicon ion implantation of large volume on one hand, and one more crystallization annealing process is required on the other hand. Moreover, the element uniformity issue exists.

To this day, the effect of silicon ion implantation of lower volume which will not cause the decrystallization has not been researched and applied to polysilicon.

SUMMARY OF THE INVENTION

An objective of the present invention is to provide a manufacture method of a polysilicon thin film, which can reduce the defect concentration of the polysilicon grain boundary and improve the quality of the polysilicon thin film.

Another objective of the present invention is to provide a polysilicon TFT structure, which can reduce the grain boundary potential barrier in the activation stage, and enlarge the carrier mobility, and increase the on state current, and decrease the threshold voltage, and improve the TFT property.

The present invention further provides a manufacture method of a polysilicon thin film, comprising steps of:

step 1, providing a substrate, and forming the polysilicon thin film on the substrate, and a thickness of the polysilicon thin film accords with a required thickness of manufacturing a semiconductor element;

step 2, implementing silicon slef-ion implantation to the polysilicon thin film, and an implantation volume of silicon ion is lower than a measurement limit for making polysilicon be decrystallized.

The manufacture method of the polysilicon thin film further comprises: step 3, implementing post annealing process to the polysilicon thin film, of which the silicon self-ion implantation is accomplished.

The substrate in the step 1 is a silicon substrate covered with a buffer layer, a glass substrate covered with a buffer layer or a flexible substrate covered with a buffer layer, and material of the buffer layer is Silicon Oxide, Silicon Nitride or a combination of the two.

the step 1 forms the polysilicon thin film by direct vapor deposition of the polysilicon;

or, the step 1 makes amorphous silicon be crystallized to form the polysilicon thin film by solid phase crystallization or metal induced crystallization;

or, the step 1 employs laser or LED as a heat source to make amorphous silicon generate liquid phase crystallization to form the polysilicon thin film.

The step 2 employs an ion implanter, or ion sprayer for implementing silicon self-ion implantation to the polysilicon thin film.

The step 3 employs a furnace or a rapid thermal annealing apparatus for implementing post annealing process.

Before implementing silicon self-ion implantation to the polysilicon thin film, a protective layer is further required to be deposed on the polysilicon thin film, and material of the protective layer is Silicon Oxide, Silicon Nitride or a combination of the two.

The present invention further provides a manufacture method of a polysilicon thin film, comprising steps of:

step 1, providing a substrate, and forming the polysilicon thin film on the substrate, and a thickness of the polysilicon thin film accords with a required thickness of manufacturing a semiconductor element;

step 2, implementing silicon self-ion implantation to the polysilicon thin film, and an implantation volume of silicon ion is lower than a measurement limit for making polysilicon be decrystallized;

step 3, implementing post annealing process to the polysilicon thin film, of which the silicon self-ion implantation is accomplished;

wherein the substrate in the step 1 is a silicon substrate covered with a buffer layer, a glass substrate covered with a buffer layer or a flexible substrate covered with a buffer layer, and material of the buffer layer is Silicon Oxide, Silicon Nitride or a combination of the two;

wherein the step 2 employs an ion implanter, or ion sprayer for implementing silicon self-ion implantation to the polysilicon thin film.

The present invention further provides a polysilicon TFT structure, comprising: a substrate, a buffer layer covering the substrate, an island shaped semiconductor layer positioned on the buffer layer, a gate isolation layer covering the island shaped semiconductor layer, a gate positioned on the gate isolation layer, a passivation layer positioned on the gate and the gate isolation layer, and a source and a drain positioned on the passivation layer;

the island shaped semiconductor layer comprises a channel area and a source contact area and a drain contact area respectively positioned at two sides of the channel area, and the source contacts the source contact area, and the drain contacts the drain contact area;

the island shaped semiconductor layer is formed by the polysilicon thin film manufactured by the aforesaid manufacture method of the polysilicon thin film after photolithography and ion doping, and the source contact area and the drain contact area correspond to an area of ion doping;

the polysilicon TFT structure belongs to a P-type TFT element or a N-type TFT element.

Material of the gate isolation layer and the passivation layer is Silicon Oxide, Silicon Nitride or a combination of the two, and material of the gate, the source and the drain is Aluminum.

The benefits of the present invention are: the present invention provides a manufacture method of a polysilicon thin film. With implementing silicon self-ion implantation to the polysilicon thin film, and an implantation volume of silicon ion is lower than a measurement limit for making polysilicon be decrystallized for making the implanted silicon ion to form interstitial silicon to move to the polysilicon grain boundary, the defect concentration of the polysilicon grain boundary can be reduced and the quality of the polysilicon thin film can be improved. The present invention provides a polysilicon TFT structure, of which the island shaped semiconductor layer is manufactured by the polysilicon thin film after low volume silicon self-ion implantation, which can reduce the grain boundary potential barrier in the activation stage, and enlarge the carrier mobility, and increase the on state current, and decrease the threshold voltage, and improve the TFT property.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
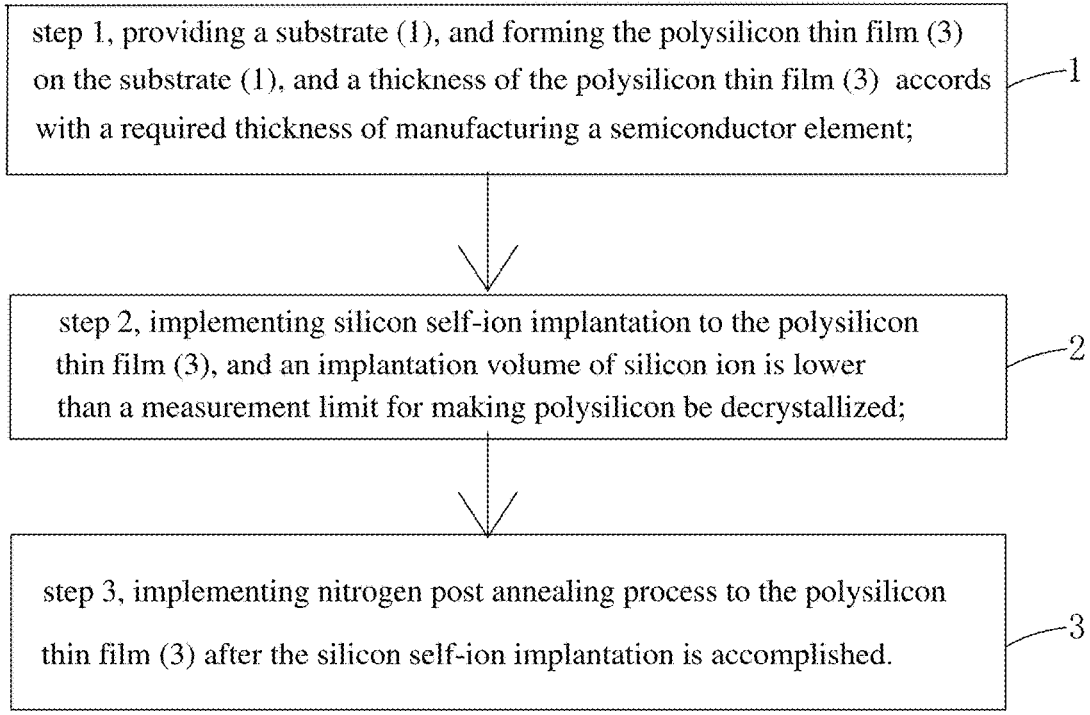
FIG. 1 is a flowchart of a manufacture method of a polysilicon thin film according to the present invention.
Figure 2:
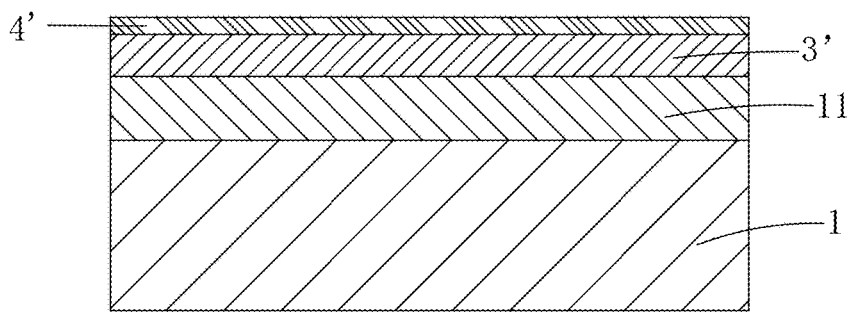
FIG. 2, FIG. 3 are diagrams of the step 1 of the manufacture method of the polysilicon thin film according to the present invention.
Figure 3:
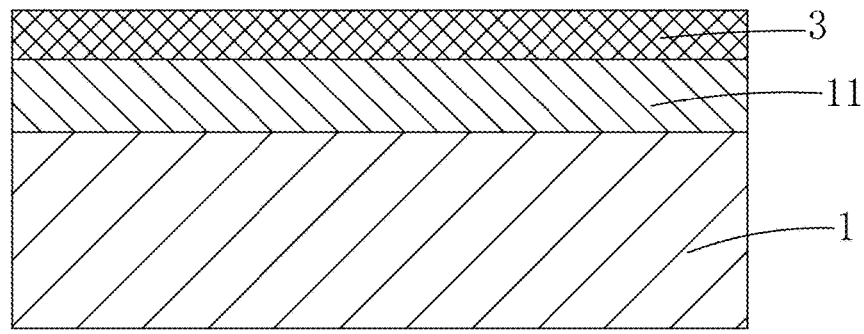

Please refer to FIG. 1. The present invention first provides a manufacture method of a polysilicon thin film, comprising steps of:

step 1, referring to FIG. 2 and FIG. 3, providing a substrate 1, and forming the polysilicon thin film 3 on the substrate 1, and a thickness of the polysilicon thin film 3 accords with a required thickness of manufacturing a semiconductor element.

Specifically, the substrate 1 in the step 1 is a silicon substrate covered with a buffer layer 11, a glass substrate covered with a buffer layer 11 or a flexible substrate covered with a buffer layer 11, and material of the buffer layer 11 is Silicon Oxide, Silicon Nitride or a combination of the two, and preferably, the material of the buffer layer 11 is Silicon Oxide ($SiO_2$).

The step 1 can form the polysilicon thin film 3 by direct vapor deposition of the polysilicon.

Or, the step 1 can make amorphous silicon be crystallized to form the polysilicon thin film 3 by solid phase crystallization or metal induced crystallization.

Or, the step 1 can employ laser or LED as a heat source to make amorphous silicon generate liquid phase crystallization to form the polysilicon thin film 3.

Furthermore, as shown in FIG. 2 and FIG. 3, employing metal induced crystallization to make amorphous silicon be crystallized to form the polysilicon thin film 3 is illustrated. The detail procedure of the step 1 is: first, employing low pressure chemical vapor deposition (LPCVD) to depose an amorphous silicon thin film 3', of which the thickness is 50 nm; then, deposing a thin layer (the thickness<5 nm) of metal nickel 4'; and then, implementing nitrogen annealing to crystallize amorphous silicon, and the annealing temperature is 600° C., and the annealing period is 10 hours; after the crystallization of amorphous silicon is accomplished to form the polysilicon thin film 3, the warmed sulfuric acid and Hydrogen peroxide mixture is employed to clean the substrate 1 to remove the residual metal nickel 4'.

Step 2, implementing silicon self-ion implantation to the polysilicon thin film 3, and an implantation volume of silicon ion is lower than a measurement limit for making polysilicon be decrystallized. Preferably, the implantation volume of silicon ion is $4 \times 10^{14}/cm^2$-$8 \times 10^{14}/cm^2$.

Figure 4:
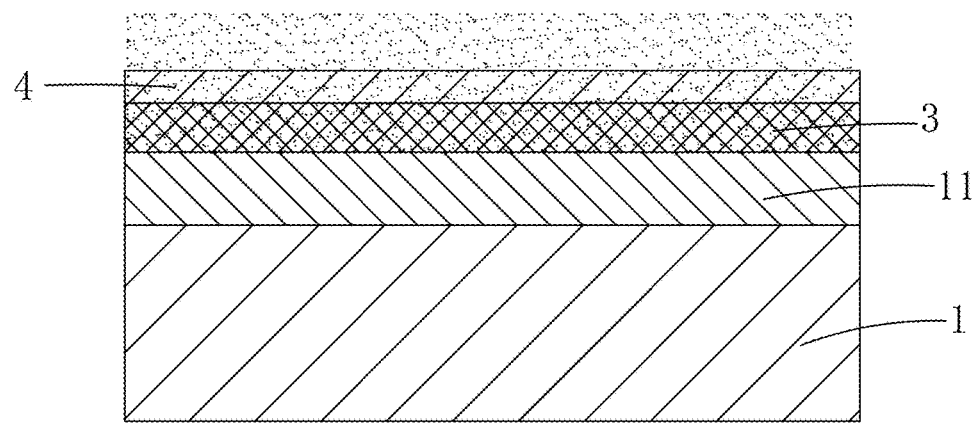
FIG. 4 is a diagram of the step 2 of the manufacture method of the polysilicon thin film according to the present invention.

Specifically, as shown in FIG. 4, employing metal induced crystallization to make amorphous silicon be crystallized to form the polysilicon thin film 3 is still illustrated. A protective layer 4 can be deposed on the polysilicon thin film 3 on practical demands before the silicon self-ion implantation is implemented to the polysilicon thin film 3. The thickness of the protective layer 4 can be selected according to the energy volume of the following silicon ion implantation. Certainly, the protective layer 4 can be omitted. In this embodiment, the protective layer 4 with thickness 25 nm is deposed, and material of the protective layer 4 is Silicon Oxide, Silicon Nitride or a combination of the two. Preferably, material of the protective layer 4 is $SiO_2$; then, an ion implanter, or ion sprayer is employed for implementing silicon ion implantation to the polysilicon thin film 3. The implantation energy is 15 keV.

Figures 5, 6:
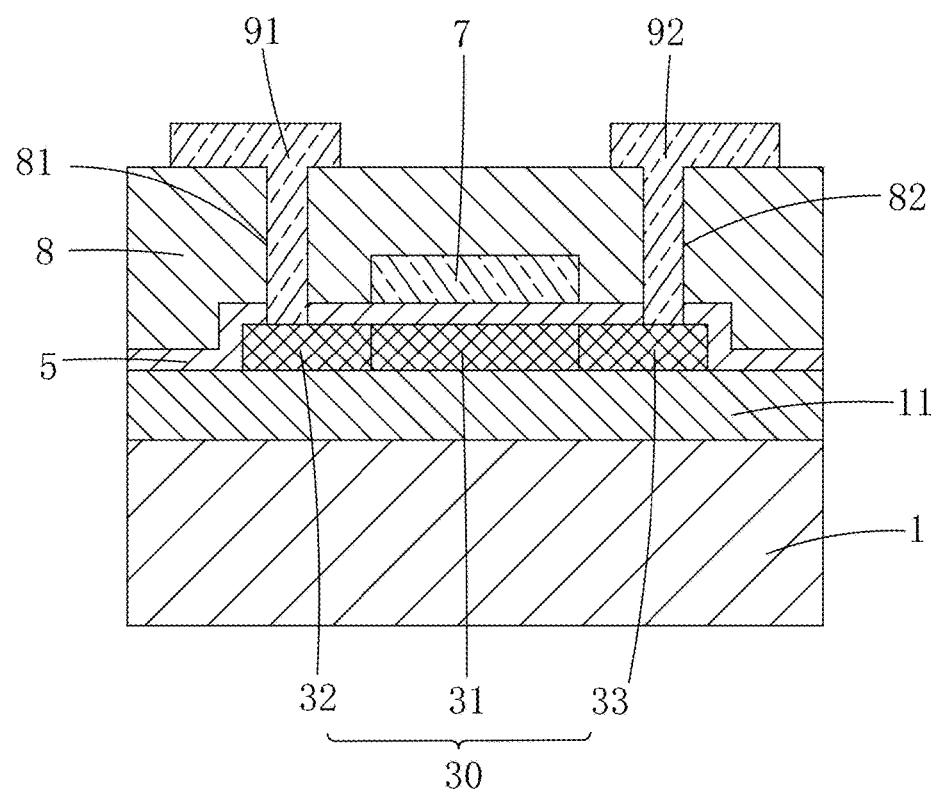
FIG. 5 shows various silicon ion implantation volumes and the corresponding sample label list in the step 2 of the manufacture method of the polysilicon thin film according to the present invention.
FIG. 6 is a sectional diagram of a polysilicon TFT structure according to the present invention.

For verifying the influence of the silicon ion implantation volume to the polysilicon thin film and the performance of the final product, polysilicon TFT, the present invention implements experiments with multiple samples with various silicon ion implantation volumes: as shown in FIG. 5, the samples of which the silicon ion implantation volumes respectively are $2 \times 10^{14}/cm^2$, $4 \times 10^{14}/cm^2$, $6 \times 10^{14}/cm^2$, $8 \times 10^{14}/cm^2$, $10 \times 10^{14}/cm^2$, $100 \times 10^{14}/cm^2$ are labeled with 1, 2, 3, 4, 5, 6, and twenty samples of every labels are respectively selected for implementing the following performance test for the polysilicon TFT.

After the step 2 is accomplished, the step 3 is further required to be implemented. The nitrogen post annealing process is implemented to the polysilicon thin film 3 after the silicon self-ion implantation is accomplished, and the temperature of the nitrogen post annealing process is 600° C., and the annealing period is 4 hours.

The manufacture method of the polysilicon thin film according to the present invention makes the implanted silicon ion to form interstitial silicon to move to the polysilicon grain boundary, which can reduce the defect concentration of the polysilicon grain boundary and improve the quality of the polysilicon thin film.

Please refer to FIG. 6. On the basis of the aforesaid manufacture method of the polysilicon thin film, the present invention further provides a polysilicon TFT structure, comprising a substrate 1, a buffer layer 11 covering the substrate 1, an island shaped semiconductor layer 30 positioned on the buffer layer 11, a gate isolation layer 5 covering the island shaped semiconductor layer 30, a gate 7 positioned on the gate isolation layer 5, a passivation layer 8 positioned on the gate 7 and the gate isolation layer 5, and a source 91 and a drain 92 positioned on the passivation layer 8.

The procedure of manufacturing the polysilicon TFT structure is: after manufacturing the polysilicon thin film 3 according to the aforesaid method, the photolithography is first implemented to the polysilicon thin film 3 to be an island shape, and then, LPCVD is employed to depose the gate isolation layer 5 of the thickness 50 nm, and material of the gate isolation layer 5 is Silicon Oxide, Silicon Nitride or a combination of the two, of which $SiO_2$ is preferred; then, Aluminum of the thickness 300 nm is deposed and the photolithography is implemented to form the gate 7; and then, the gate 7 is employed to be shield to implement ion implantation doping of self-alignment to the island shape polysilicon thin film after photolithography, and the volume of the ion implantation is $4 \times 10^{15}/cm^2$, and the implantation energy is 20 keV to make the island shape polysilicon thin film become the island shape oxide semiconductor layer 30, wherein the source contact area 32 and the drain contact area 33 are formed corresponding to the area of ion doping, and the area shielded by the gate 7 which is not implemented with ion doping becomes the channel area 30; next, LPCVD is employed to depose the passivation layer 8 of the thickness 500 nm, and a first via hole 81 and a second via hole 82 are opened to the passivation layer 8 and the gate isolation layer 5 correspondingly above the source contact area 32 and the drain contact area 33, and material of the passivation layer 8 is Silicon Oxide, Silicon Nitride or a combination of the two, of which $SiO_2$ is preferred; Aluminum (containing 1 silicon) of the thickness 700 nm is sputtered and the photolithography is implemented to be the source 91 and the drain 92, and the source 91 contacts the source contact area 32 through the first via hole 81, and the drain 92 contacts the drain contact area 33 through the second via hole 82; At last, 30 minutes hydrogen treatment is implemented.

In the aforesaid procedure of manufacturing the polysilicon TFT structure, according to the various ion implanted to the island shape polysilicon thin film, a P-type TFT element or a N-type TFT element can be manufactured. For example, implanting boron ion can manufacture the P-type TFT element, and implanting phosphorous ion can manufacture the N-type TFT element.

After manufacturing multiple polysilicon TFTs in accordance with samples of various labels, in room temperature, the HP4156B semiconductor parameter analyzer is employed to implement performance test to the polysilicon TFTs and calculates the average carrier mobility of the multiple polysilicon TFTs in accordance with the samples of the same label.

Figures 7, 8:
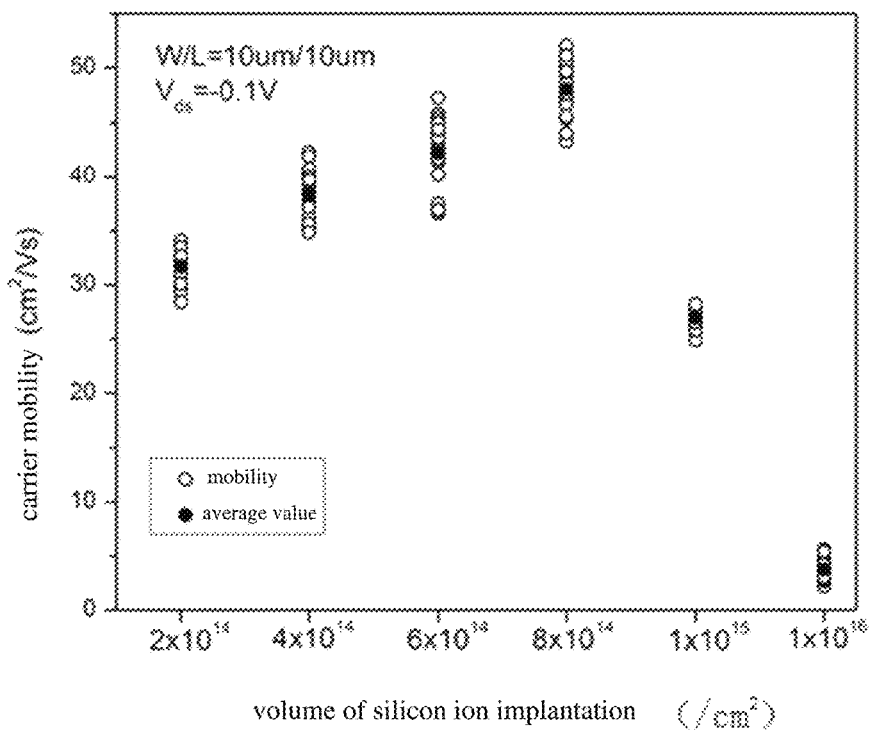
FIG. 7 is a test result diagram of implementing carrier mobility test to the polysilicon TFTs employing various samples.
FIG. 8 is a data sheet in accordance with FIG. 7.

As shown in FIG. 7, FIG. 8, both the length L and the width W of the channel area of the polysilicon TFT are 10 μm, and the source-drain voltage $V_{ds}$ is −0.1V. In the range of $4 \times 10^{14}/cm^2$-$8 \times 10^{14}/cm^2$, the carrier mobility is improved. With the increase of the volume of the silicon ion implantation, the carrier mobility also increases. This is because the implantation volume of silicon ion is lower than a measurement limit for making polysilicon be decrystallized. The implanted silicon ion forms interstitial silicon to move to the polysilicon grain boundary, which can reduce the defect concentration of the polysilicon grain boundary. When the volume of the silicon ion implantation is larger than or equal to $1 \times 10^{15}/cm^2$, the carrier mobility obviously descends. This is because a large amount of silicon ions are implanted in the polysilicon thin film, and the polysilicon is decrystallized in different levels. The manufacture method of the present invention does not implement high temperature annealing recrystallization treatment to the polysilicon thin film implanted with silicon ion. The lattice structure of the polysilicon has been damaged to cause the performance degradation of the polysilicon TFT. The test result verifies: it is correct that the manufacture method of polysilicon thin film 3 according to the present invention sets the volume of silicon self-ion implantation to be lower than a measurement limit for making polysilicon be decrystallized.

In conclusion, the manufacture method of the polysilicon thin film according to the present invention, with implementing silicon self-ion implantation to the polysilicon thin film, and an implantation volume of silicon ion is lower than a measurement limit for making polysilicon be decrystallized for making the implanted silicon ion to form interstitial silicon to move to the polysilicon grain boundary, can reduce the defect concentration of the polysilicon grain boundary and improve the quality of the polysilicon thin film. In the polysilicon TFT structure according to the present invention, the island shaped semiconductor layer is manufactured by the polysilicon thin film after low volume silicon self-ion implantation, which can reduce the grain boundary potential barrier in the activation stage, and enlarge the carrier mobility, and increase the on state current, and decrease the threshold voltage, and improve the TFT property.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a polysilicon thin film, comprising steps of:
    step 1, providing a substrate and forming a polysilicon thin film of a predetermined thickness on a surface of the substrate; and
    step 2, implementing silicon self-ion implantation to the polysilicon thin film, wherein implantation of silicon ions is conducted with a dosage and an energy level that prevent the polysilicon thin film from being decrystallized, wherein the energy level is 15 keV.

2. The manufacturing method of the polysilicon thin film according to claim 1, further comprising:
    step 3, implementing a post annealing process to the silicon self-ion implanted polysilicon thin film.

3. The manufacturing method of the polysilicon thin film according to claim 2, wherein the step 3 employs a furnace or a rapid thermal annealing apparatus for implementing post annealing process.

4. The manufacturing method of the polysilicon thin film according to claim 1, wherein the substrate in the step 1 is a silicon substrate covered with a buffer layer, a glass substrate covered with a buffer layer or a flexible substrate covered with a buffer layer, and a material of the buffer layer is silicon oxide, silicon nitride, or a combination of the two.

5. The manufacturing method of the polysilicon thin film according to claim 1, wherein the step 1 forms the polysilicon thin film by direct vapor deposition of the polysilicon;
    or, the step 1 crystallizes amorphous silicon to form the polysilicon thin film by solid phase crystallization or metal induced crystallization;
    or, the step 1 employs laser or LED as a heat source to crystallize amorphous silicon through liquid phase crystallization to form the polysilicon thin film.

6. The manufacturing method of the polysilicon thin film according to claim 5, wherein before implementing silicon self-ion implantation to the polysilicon thin film, a protective layer is further required to be deposed on the polysilicon thin film, and a material of the protective layer is silicon oxide, silicon nitride, or a combination of the two.

7. The manufacturing method of the polysilicon thin film according to claim 1, wherein the step 2 employs an ion implanter, or ion sprayer for implementing silicon self-ion implantation to the polysilicon thin film.

8. A manufacturing method of a polysilicon thin film, comprising steps of:
    step 1, providing a substrate and forming a polysilicon thin film of a predetermined thickness on a surface of the substrate;
    step 2, implementing silicon self-ion implantation to the polysilicon thin film, wherein implantation of silicon ions is conducted with a dosage and an energy level that prevent the polysilicon thin film from being decrystallized, wherein the energy level is 15 keV; and
    step 3, implementing a post annealing process to the silicon self-ion implanted polysilicon thin film;
    wherein the substrate in the step 1 is a silicon substrate covered with a buffer layer, a glass substrate covered with a buffer layer or a flexible substrate covered with a buffer layer, and a material of the buffer layer is silicon oxide, silicon nitride, or a combination of the two;
    wherein the step 2 employs an ion implanter, or ion sprayer for implementing silicon self-ion implantation to the polysilicon thin film.

9. The manufacturing method of the polysilicon thin film according to claim 8, wherein the step 1 forms the polysilicon thin film by direct vapor deposition of the polysilicon;
    or, the step 1 crystallizes amorphous silicon to form the polysilicon thin film by solid phase crystallization or metal induced crystallization;
    or, the step 1 employs laser or LED as a heat source to crystallize amorphous silicon through liquid phase crystallization to form the polysilicon thin film.

10. The manufacturing method of the polysilicon thin film according to claim 9, wherein before implementing silicon self-ion implantation to the polysilicon thin film, a protective layer is further required to be deposed on the polysilicon thin film, and a material of the protective layer is silicon oxide, silicon nitride, or a combination of the two.

11. The manufacturing method of the polysilicon thin film according to claim 8, wherein the step 3 employs a furnace or a rapid thermal annealing apparatus for implementing post annealing process.

* * * * *